(12) United States Patent
Vilhonen

(10) Patent No.: US 7,541,863 B2
(45) Date of Patent: *Jun. 2, 2009

(54) TRANSFERRED-IMPEDANCE FILTERING IN RF RECEIVERS

(75) Inventor: Sami Vilhonen, Littoinen (FI)

(73) Assignee: Nokia Corporation, Espoo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 11/795,926

(22) PCT Filed: Mar. 17, 2006

(86) PCT No.: PCT/IB2006/000600
§ 371 (c)(1),
(2), (4) Date: Mar. 14, 2008

(87) PCT Pub. No.: WO2006/097835
PCT Pub. Date: Sep. 21, 2006

(65) Prior Publication Data
US 2008/0224763 A1    Sep. 18, 2008

Related U.S. Application Data

(63) Continuation-in-part of application No. 11/092,952, filed on Mar. 18, 2005, now Pat. No. 7,187,230.

(51) Int. Cl.
*H03B 1/00* (2006.01)
*H03K 5/00* (2006.01)
*H04B 1/10* (2006.01)

(52) U.S. Cl. .................... 327/552; 330/302
(58) Field of Classification Search ......... 327/551–559, 327/355–361; 330/302
See application file for complete search history.

(56) References Cited

U.S. PATENT DOCUMENTS

| | | | |
|---|---|---|---|
| 6,133,793 A * | 10/2000 | Lau et al. ..................... | 330/302 |
| 6,831,497 B2 * | 12/2004 | Koh et al. ..................... | 327/254 |
| 6,937,644 B2 * | 8/2005 | Pan et al. ..................... | 375/147 |
| 6,990,327 B2 * | 1/2006 | Zheng et al. ................. | 455/307 |
| 7,187,230 B2 * | 3/2007 | Vilhonen ...................... | 327/552 |
| 7,266,360 B2 * | 9/2007 | Kang et al. .................. | 455/302 |
| 2002/0183016 A1 | 12/2002 | Kemmochi et al. | |
| 2004/0239442 A1 | 12/2004 | Wilcox | |

* cited by examiner

*Primary Examiner*—Dinh T. Le
(74) *Attorney, Agent, or Firm*—Banner & Witcoff, Ltd.

(57) ABSTRACT

The specification and drawings present a new method and apparatus for using transferred-impedance filtering in RF (radio frequency) receivers (e.g., inside of a mobile communication device), wherein said filtering can be done with MOS-switches transferring impedance of a regular RC or RCL circuit to RF frequency filtering inside an RFIC (radio frequency integrated circuit).

25 Claims, 9 Drawing Sheets

TRANSFERRED-IMPEDANCE FILTERING IN RF RECEIVERS

PRIORITY AND CROSS-REFERENCE TO RELATED APPLICATION

The present application is a continuation-in-part of the U.S. patent application Ser. No. 11/092,952 filed March 18, 2005, now U.S. Pat. No. 7,187,230.

TECHNICAL FIELD

This invention generally relates to communication systems, and more specifically to using transferred-impedance filtering in RF receivers.

BACKGROUND ART

The RF receivers must tolerate high blocking signals while maintaining their own performance. This requires filtering for RF-signals prior to a LNA (low noise amplifier) and in many systems also after the LNA. This is especially true in code division multiple access systems (e.g., CDMA2000 and WCDMA) where a transmitter usually sends its high-level signal while a receiver receives a very low-level signal.

At the present time, filtering is done mainly with SAW (surface acoustic wave) or BAW (bulk acoustic wave) filters or resonators. These components are expensive, impossible to integrate with a standard CMOS or BiCMOS process and also require large areas of PWBs (printed wiring boards). Such filters also decrease the possibility for modularity and also increase the number of I/O's (inputs/outputs) in RFIC's (radio frequency integrated circuits) thus increasing their complexity.

DISCLOSURE OF THE INVENTION

The object of the present invention is to provide a novel method for using transferred-impedance filtering in RF (radio frequency) receivers, wherein said filtering can be done with MOS-switches transferring impedance of a regular RC or RCL circuit to RF frequency filtering inside an RFIC (radio frequency integrated circuit).

According to a first aspect of the invention, a method for transferred-impedance filtering in a receiver, comprises the steps of: receiving a radio frequency signal and converting it to an electrical domain; amplifying the radio frequency signal in the electrical domain using an amplifier containing a resistance R, thus generating an amplified RF signal; and filtering the amplified RF signal using a transferred-impedance filter containing at least one capacitor C and having a pass band with a center frequency indicated by a reference frequency, wherein −3 dB frequencies of the pass band are given by the reference frequency plus a corner frequency which depends on the resistor R and the at least one capacitor C and by the reference frequency minus a further corner frequency which also depends on the resistor R and the at least one capacitor C.

According further to the first aspect of the invention, the corner frequency and the further corner frequency may be equal and may be given by $F_{RC}=1/\pi 2RC$. Further, the transferred-impedance filter may also perform a down conversion mixing function such that a low frequency baseband signal may be an output signal of the transferred-impedance filter.

Further according to the first aspect of the invention, the reference frequency may be a local oscillator frequency $F_{LO}$ provided to the transferred-impedance filter.

Still further according to the first aspect of the invention, the filtering may be performed using two transferred-impedance filters in inphase and quadrature branches, respectively, wherein each of two local oscillator signals having the frequency $F_{LO}$ but $\pi/2$ apart in a phase domain may be provided to only one of the two transferred-impedance filters.

According further to the first aspect of the invention, the parasitic capacitances of said transferred-impedance filter are compensated by an inductor in the amplifier such that an absolute value of a reactive component of an amplifier output impedance (for the amplified RF signal) is close to zero and negligible compared to a resistive component of said output impedance.

According still further to the first aspect of the invention, the at least one inductor L may be added in series with the at least one capacitor C and the reference frequency may be given by $F_{LO}-F_{LC}$ or $F_{LO}+F_{LC}$, the $F_{LO}$ being a local oscillator frequency provided to the transferred-impedance filter and the $F_{LC}$ being an LC resonant frequency given by $F_{LC}=1/2\pi\sqrt{LC}$.

According further still to the first aspect of the invention, the at least one inductor L may be added in parallel with the at least one capacitor C and the reference frequency may be given by $F_{LO}-F_{LC}$ or $F_{LO}+F_{LC}$, the $F_{LO}$ being a local oscillator frequency provided to the transferred-impedance filter and the $F_{LC}$ being an LC resonant frequency given by $F_{LC}=1/2\pi\sqrt{LC}$. Still further, the corner frequency and the further corner frequency further may depend on the at least one inductor L.

According yet further still to the first aspect of the invention, the receiver may be a part of a mobile terminal, mobile phone or a mobile communication device.

Yet still further according to the first aspect of the invention, the receiver may be a radio frequency (RF) receiver.

According yet still further to the first aspect of the invention, the method may comprise the steps of: attenuating by a predefined value the amplified RF signal in a separate channel from the transferred-impedance filter; and generating a subtraction signal between the filtered amplified RF signal and the attenuated amplified RF signal using a mixer. Still further, the attenuating may be variable.

According to a second aspect of the invention, a receiver for transferred-impedance filtering, comprises: an antenna, for receiving a radio frequency signal and converting it to an electrical domain; an amplifier containing a resistance R, for amplifying the radio frequency signal in the electrical domain, thus generating an amplified RF signal; and at least one transferred-impedance filter, for filtering the amplified RF signal, the transferred-impedance filter containing at least one capacitor C and having a pass band with a center frequency indicated by a reference frequency, wherein −3 dB frequencies of the pass band are given by the reference frequency plus a corner frequency which depends on the resistor R and the at least one capacitor C and by the reference frequency minus a further corner frequency which also depends on the resistor R and the at least one capacitor C.

According further to the second aspect of the invention, the corner frequency and the further corner frequency may be equal and given by $F_{RC}=1/\pi 2RC$. Further, the receiver may contain two the at least one transferred-impedance in inphase and quadrature branches, respectively, wherein each of two local oscillator signals having the frequency $F_{LO}$ but $\pi/2$ apart in a phase domain is provided to only one of the two transferred-impedance filters.

Further according to the second aspect of the invention, the reference frequency may be a local oscillator frequency $F_{LO}$ provided to the transferred-impedance filter.

Further still according to the second aspect of the invention, the transferred-impedance filter may also perform a down conversion mixing function such that a low frequency baseband signal may be an output signal of the transferred-impedance filter.

According further to the second aspect of the invention, the parasitic capacitances of said transferred-impedance filter are compensated by an inductor in the amplifier such that an absolute value of a reactive component of an amplifier output impedance (for the amplified RF signal) is close to zero and negligible compared to a resistive component of said output impedance.

According still further to the second aspect of the invention, the at least one inductor L may be added in series with the at least one capacitor C and the reference frequency may be given by $F_{LO}-F_{LC}$ or $F_{LO}+F_{LC}$, the $F_{LO}$ being a local oscillator frequency provided to the transferred-impedance filter and the $F_{LC}$ being an LC resonant frequency given by $F_{LC}=1/\pi 2LC$.

According further still to the second aspect of the invention, the at least one inductor L may be added in parallel with the at least one capacitor C and the reference frequency may be given by $F_{LO}-F_{LC}$ or $F_{LO}+F_{LC}$, the $F_{LO}$ being a local oscillator frequency provided to the transferred-impedance filter and the $F_{LC}$ being an LC resonant frequency given by $F_{LC}=1/2\pi\sqrt{LC}$. Further, the corner frequency and the further corner frequency further may depend on the at least one inductor L.

According yet further still to the second aspect of the invention, the receiver may be a part of a mobile terminal, mobile phone or a mobile communication device.

Yet still further according to the second aspect of the invention, the receiver may be a radio frequency (RF) receiver.

According yet still further to the second aspect of the invention, the receiver may comprise: an attenuator, for attenuating by a predefined value the amplified RF signal in a separate channel from the transferred-impedance filter; and a mixer, for generating a subtraction signal between the filtered amplified RF signal and the attenuated amplified RF signal. Still further, the attenuating may be variable.

According to a third aspect of the invention, a communication device, comprises: a receiver, for transferred-impedance filtering, the receiver comprises: an antenna, for receiving a radio frequency signal and converting it to an electrical domain; an amplifier containing a resistance R, for amplifying the radio frequency signal in the electrical domain, thus generating an amplified RF signal; and at least one transferred-impedance filter, for filtering the amplified RF signal, the transferred-impedance filter containing at least one capacitor C and having a pass band with a center frequency indicated by a reference frequency, wherein ba−3 dB frequencies of the pass band are given by the reference frequency plus a corner frequency which depends on the resistor R and the at least one capacitor C and by the reference frequency minus a further corner frequency which also depends on the resistor R and the at least one capacitor C.

According yet still further to the third aspect of the invention, the receiver may further comprise: an attenuator, for attenuating by a predefined value the amplified RF signal in a separate channel from the transferred-impedance filter; and a mixer, for generating a subtraction signal between the filtered amplified RF signal and the attenuated amplified RF signal.

The advantages of the present invention include (but are not limited to):

There will be no need for expensive external filtering;
Modularity will be easy to obtain since there is no fixed filtering in the receiver;
Many I/O's will be saved; and
Saving PWB area.

BRIEF DESCRIPTION OF THE DRAWINGS

For a better understanding of the nature and objects of the present invention, reference is made to the following detailed description taken in conjunction with the following drawings, in which.

BEST MODE FOR CARRYING OUT THE INVENTION

The present invention provides a method and apparatus for using transferred-impedance filtering in RF (radio frequency) receivers (e.g., inside of a mobile communication deice), wherein said filtering can be done with MOS-switches transferring impedance of a regular RC or RCL circuit to RF frequency filtering inside an RFIC (radio frequency integrated circuit).

Figure 1:
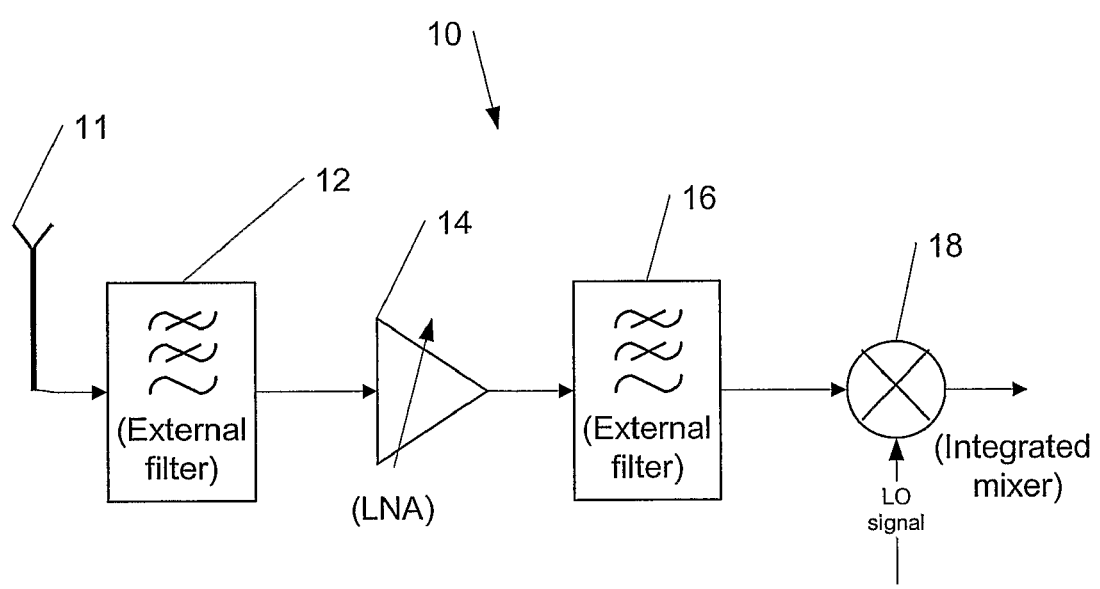
FIG. 1 is a block diagram of a front end of an RF receiver, according to the prior art.

FIG. 1 shows an example of a block diagram of a front end of an RF receiver 10, according to the prior art. An antenna 11 receives a radio frequency signal and converts it to an electrical domain. Then the signal is filtered first using an external filter 12, amplified using a low noise amplifier (LNA) 14 and filtered again using an external filter 16 before it is provided to a mixer 18 as a part of a normal algorithm, according to the prior art.

Figure 2A:
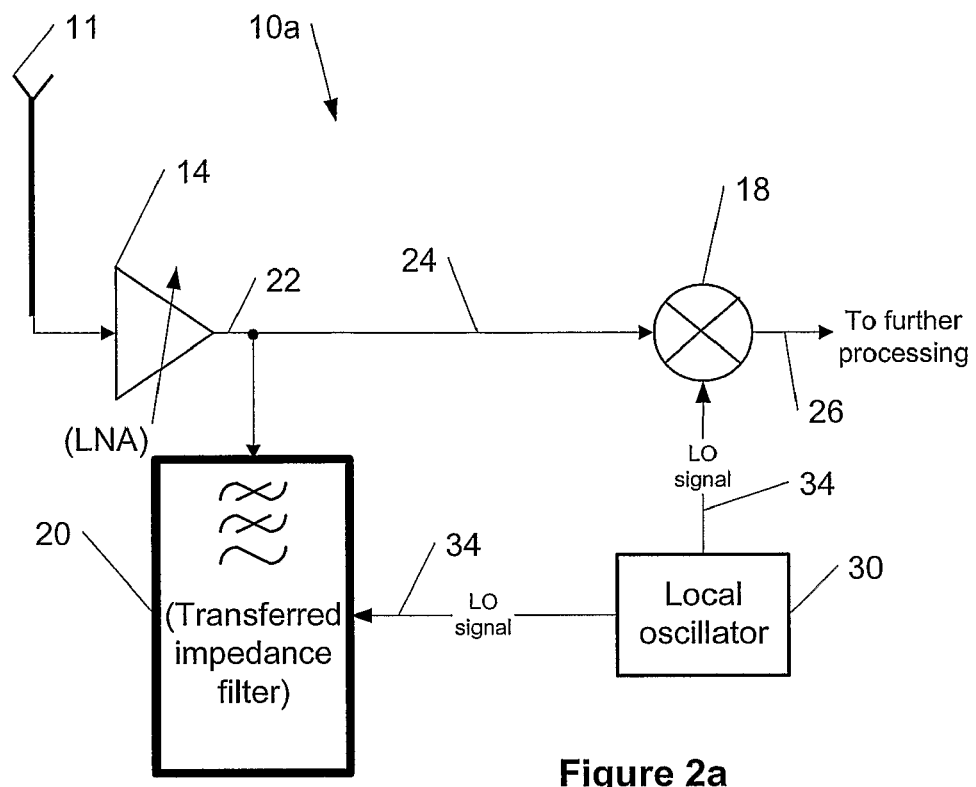
FIGS. 2a and 2b are block diagrams of a front end of an RF receiver, according to embodiments of the present invention.
Figure 2B:
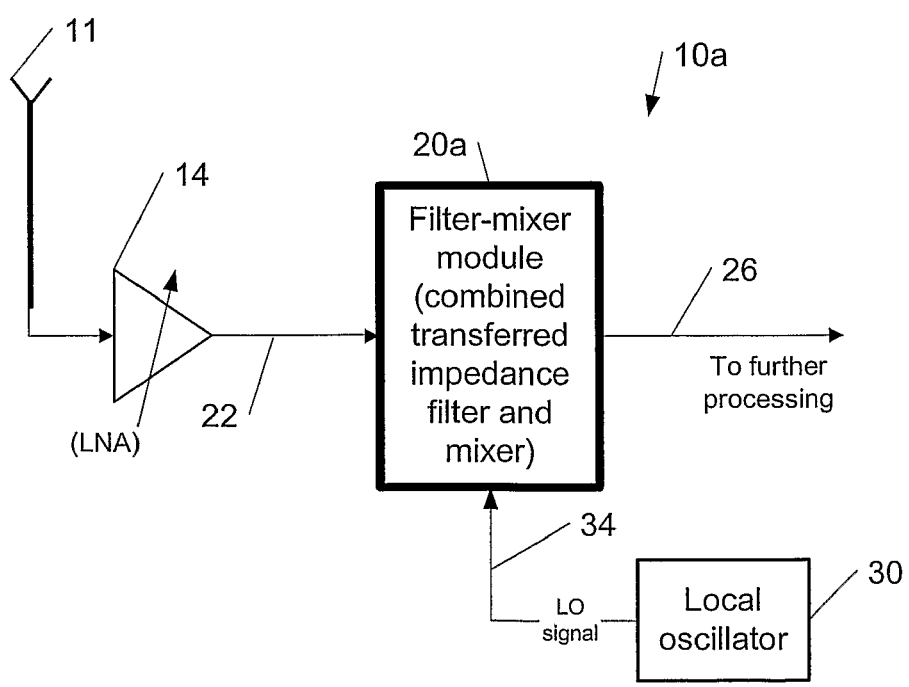

FIGS. 2a and 2b show examples among others of block diagrams of a front end of RF receivers 10a and 10b, respectively, according to embodiments of the present invention. Compared to the prior art processing shown in FIG. 1, a new transferred-impedance circuitry is used instead of the external filters 12 and 16.

FIG. 2a corresponds to a case where the low noise amplifier (or in general just an amplifier) 14 is connected in parallel with the transferred-impedance filter 20 using an amplified RF signal 22, and the output RF signal 24 is provided to the mixer 18 for a normal further processing. In this scenario a LO (local oscillator) signal 34 with a frequency $F_{LO}$ can be provided to both the transferred-impedance filter 20 and to the mixer 18 by a local oscillator 30.

FIG. 2b demonstrates a further improvement of the present invention wherein the transferred-impedance filter 20 fulfills a function of the mixer 18 and is shown as a filter-mixer module 20a, so its output signal 26 is the same as the output signal of the mixer 18. A more detailed description for implementing blocks 14, 20 and 20a presented in FIGS. 2a and 2b is provided below.

Figure 3A:
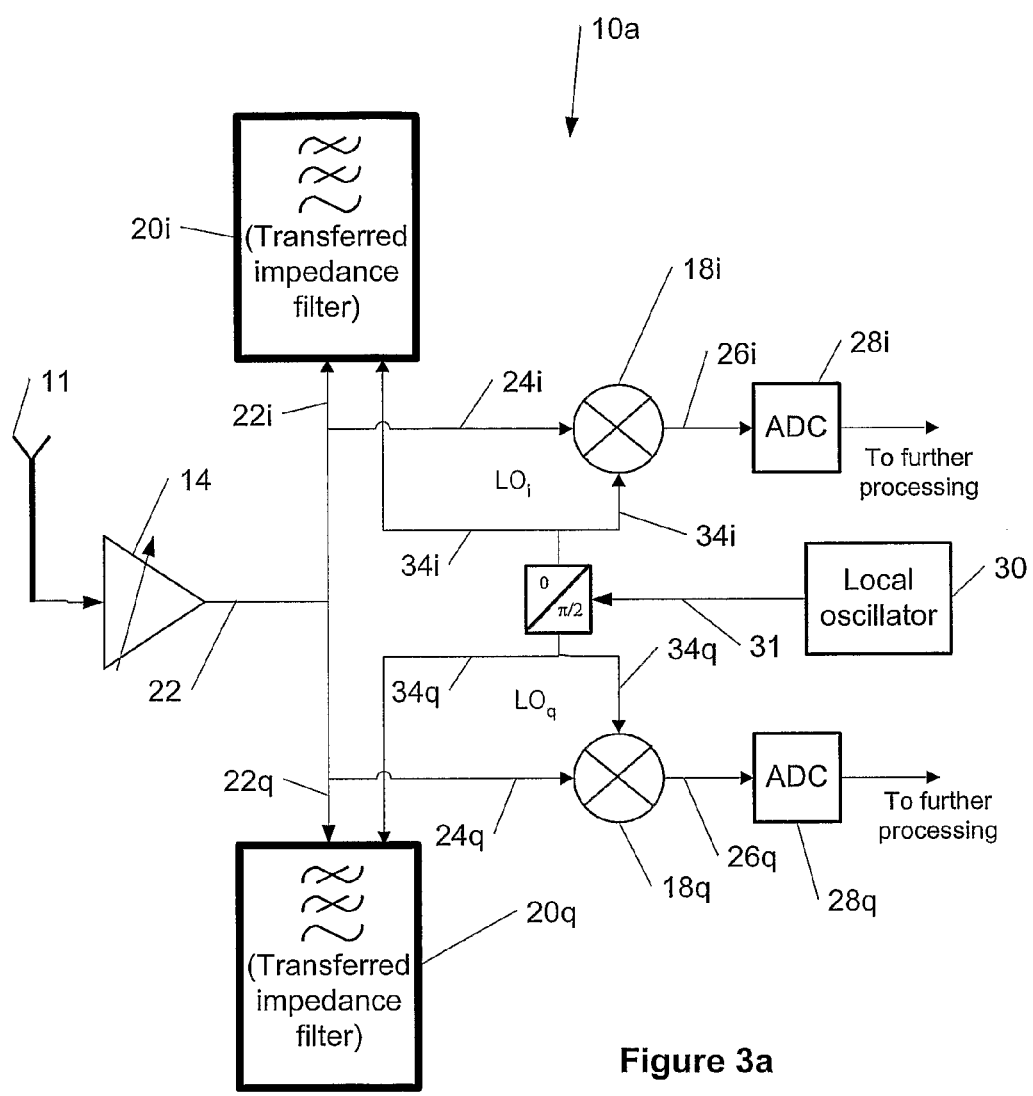
FIGS. 3a and 3b are block diagrams of a front end of an RF receiver showing inphase and quadrature branches, according to an embodiment of the present invention.
Figure 3B:
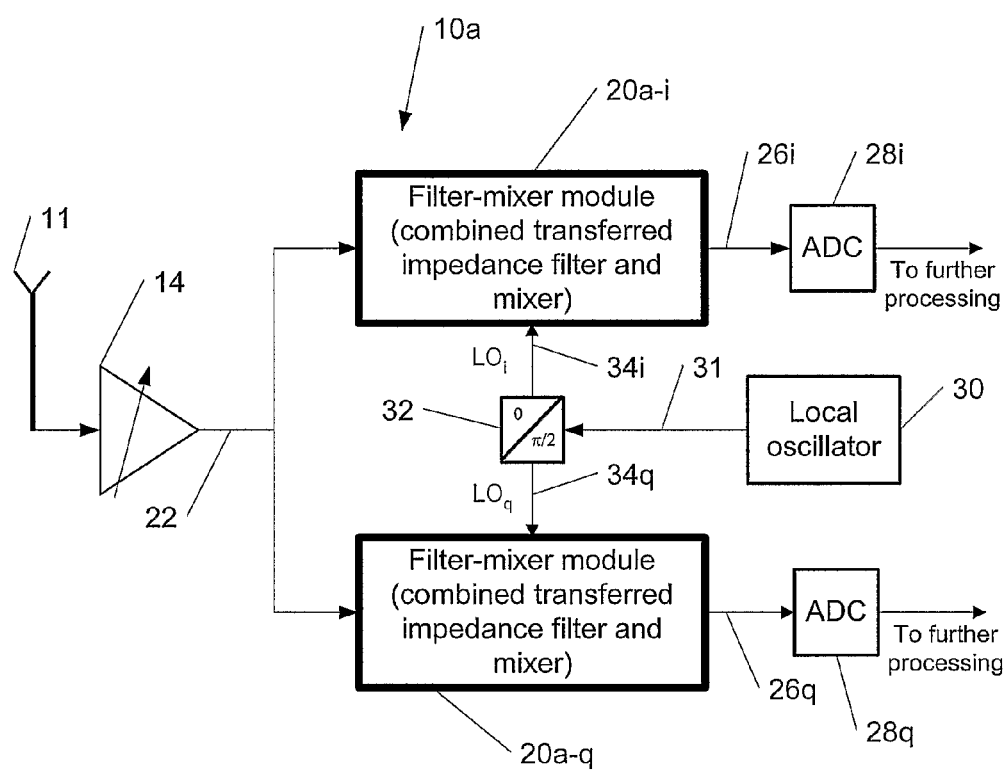

FIGS. 3a and 3b show examples among others of block diagrams of front end receivers 10a and 10b, respectively, showing inphase and quadrature branches, according to embodiments of the present invention. In FIG. 3a there are two said transferred-impedance filters 20i and 20q for operating in inphase and quadrature branches with inputs (amplified RF signals) 22i and 22q, respectively, wherein two local oscillator (LO) signals 34i and 34q have the frequency $F_{LO}$ but $\pi/2$ apart in a phase domain are provided to the two transferred impedance filters 20a-i and 20a-q, respectively, in order to prevent inphase and quadrature branches interfering with each other, a duty cycle for the LO signals 34i and 34q can be changed from a normally used duty cycle of 50:50 to 25:75, according to an embodiment of the present invention. This can be implemented using appropriate switches (not shown in FIGS. 3a and 3b).

Furthermore, mixers 28i and 28q, in response to output RF signals 24i and 24q, provide output signals 26i and 26q to analog-to-digital converters 28i and 28q, respectively, for further processing. FIG. 3b depicts a similar arrangement but with a filter-mixer module 20a-i instead of the blocks 20i and 28i and with a filter-mixer module 20a-q instead of the blocks 20a-q and 28q, respectively, as described above.

Figure 4:
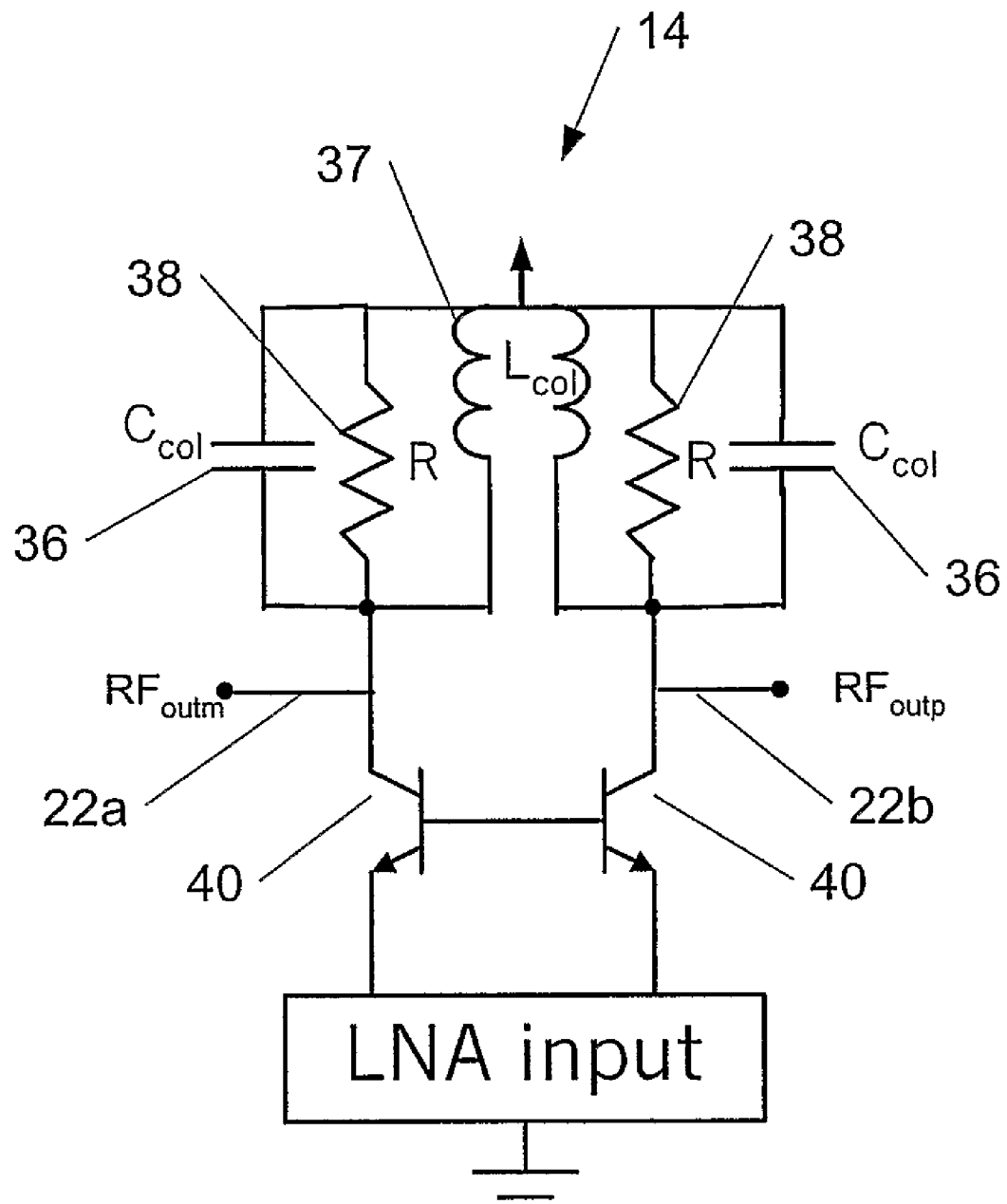
FIG. 4 is a simplified schematic of a low noise amplifier.

FIG. 4 shows an example among others of a simplified schematic of the low noise amplifier (or generally an amplifier) 14 utilizing a differential transistor pair 40. In FIG. 4 the inductors Lcol 37 compensate the capacitive part of the LNA output impedance (i.e., for amplified RF signals 22, 22i or 22q), and said capacitive part includes Ccol 36 and the parasitic capacitance of the transferred-impedance filter 20 (or similarly of the blocks 20i, 20q, 20a, 20a-i and 20a-q). Thus, parasitic capacitances are compensated by the inductor 37 such that an absolute value of a reactive component of the LNA output impedance for the amplified RF signal 22 is close to zero and negligible compared to a resistive component of the LNA output impedance for said amplified RF signal 22 determined by the resistance 38. Consequently, the amplified RF signal which is shown in FIG. 4 as $RF_{outm}$ and $RF_{outp}$ signals 22a and 22b, (which can represent amplified RF signals 22, 22i or 22q as differential signals so these RF signals 22, 22i or 22q can be positive or negative), respectively, is dominated by the resistor R 38.

Figure 5A:
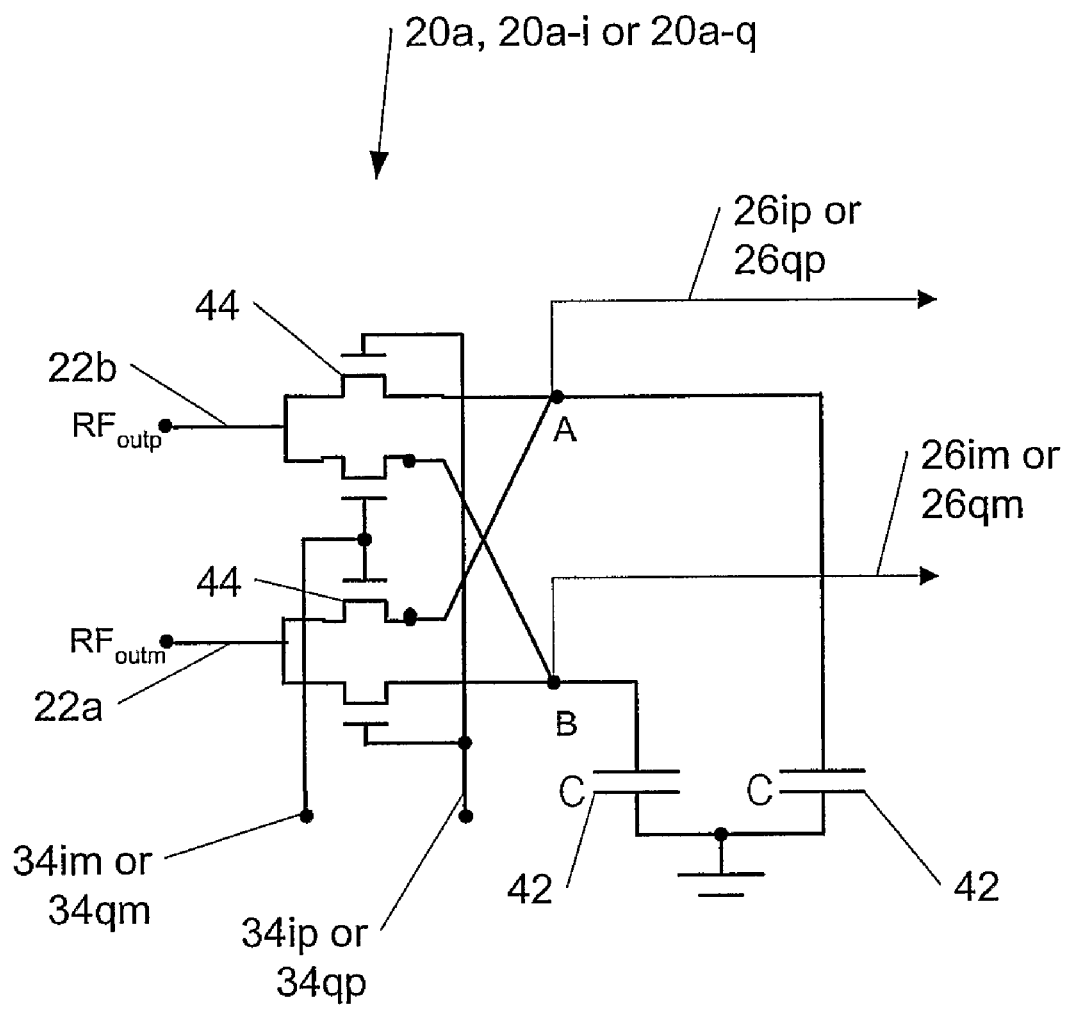
FIGS. 5a, 5b and 5c are simplified schematics of a transferred-impedance filter, according to embodiments of the present invention.
Figure 5B:
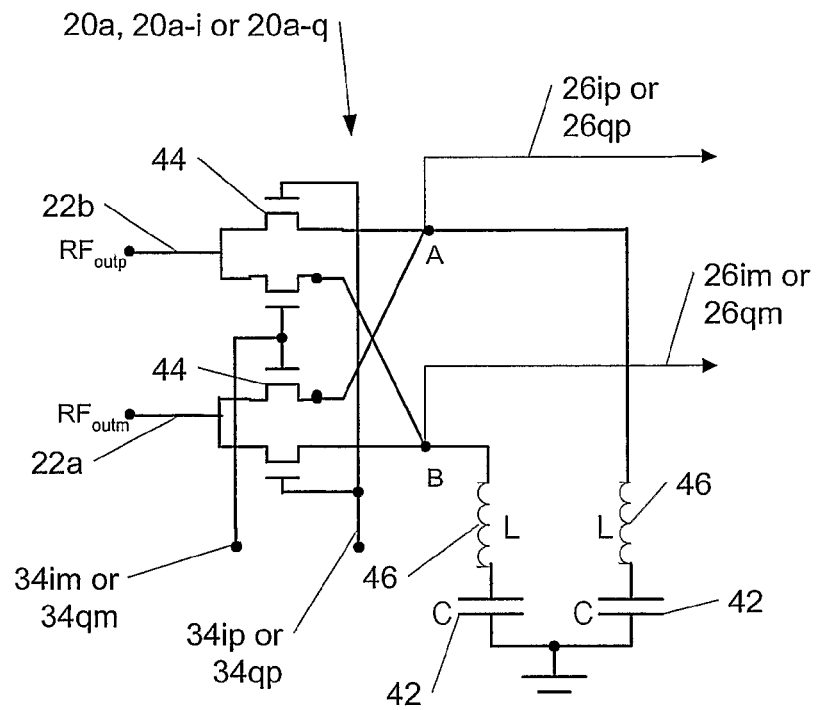
Figure 5C:
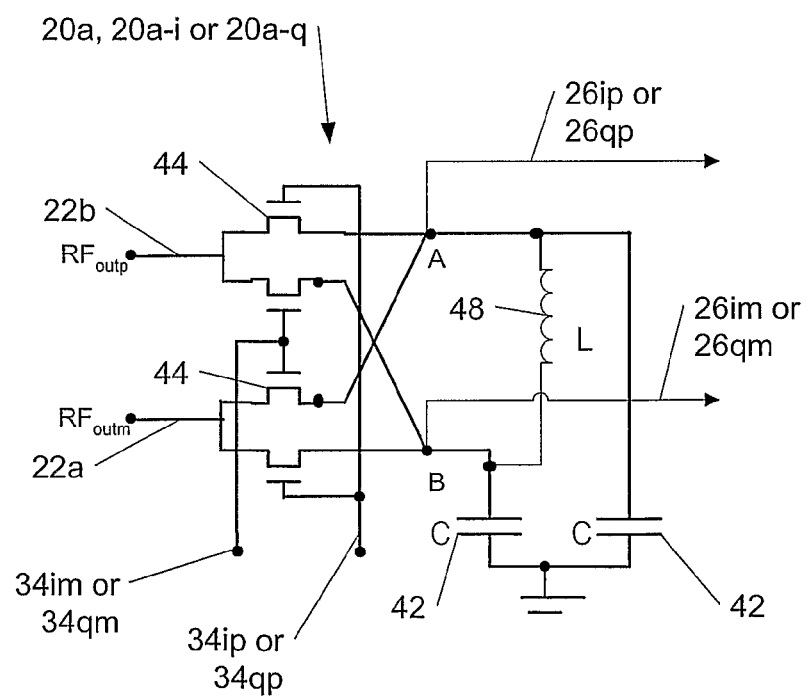

FIGS. 5a, 5b and 5c are examples among others of a simplified schematic of the filter-mixer module 20a (or similarly of modules 20a-i and 20a-q), according to embodiments of the present invention utilizing MOSFETs (metal-oxide-semiconductor field-effect transistors) 44.

In one embodiment of the present invention shown in FIG. 5a, MOSFETs are being switched with LO (local oscillator) signal between on and off states. Capacitors C 42 are then switched between $RF_{outp}$ and $RF_{outm}$ ports. The transferred-impedance filter 20 is connected at the LNA 14 outputs $RF_{outm}$ and $RF_{outp\ signals\ 22}$a and 22b (these signals can be collector or drain signals) shown in FIG. 4.

If the incoming RF signal (e.g., amplified RF signals 22, 22i or 22q) differs from the frequency of the LO signal 34, then the capacitors C 42 will be charged with a signal which frequency is the difference of the RF and LO signals. The driving impedance is the impedance of the LNA output, which is the resistor R 38. Therefore we get impedance filtering at the frequency $F_{LO}+F_{RC}$, where $F_{LO}$ is the LO-signal frequency and $F_{RC}$ is the corner frequency of the resistor R 38 and the capacitor C 42 (i.e., $1/2\pi RC$).

This means that we get a band pass filter at the LNA 14 output with pass band corner frequencies (also called $-3$ dB frequencies or half-power frequencies) $F_{LO}+F_{RC}$ and $F_{LO}-F_{RC}$, respectively. This band pass filter then follows the LO-signal and there is enough attenuation for adjacent channels, blockers and for a transmitter (connected to the antenna 11 but not shown in FIGS. 2a or 2b).

The shape of this filter is also very steep, since the attenuation increases as a function of the RC constant corresponding to low frequencies. This is easier to explain with an example. If the LO frequency is 2GHz and an RC time constant is equivalent to 2 MHz, then the signal of frequency 2.002 GHz attenuates 3 dB. If we had a standard RC–3dB point at that frequency, 20 dB attenuation would be reached at the frequency of 20.002 GHz (i.e., one decade away). With the filter-mixer module 20a (similarly for modules 20a-i or 20a-q), the 20 dB attenuation will be reached at 2.022 GHz (i.e., one decade away from the RC frequency 2 MHz). Thus the low frequency (defined by the RC constant) is transferred to the RF frequencies. This is a significant improvement over the possible prior art solutions.

It is noted that other impedances can be transferred to higher frequency filtering using the methodology described in the present invention. The capacitors 42 in FIG. 5a can be replaced with an LC-resonator. This is especially important in CDMA2000 handsets which must tolerate high blocker only 900 kHz away from its own LO-frequency. FIGS. 5b and 5c demonstrate LC resonator options.

According to an embodiment of the present invention, as shown in FIG. 5b, inductors L 46 are added in series with the capacitors C 42 (compared to FIG. 5a) and the center frequency of the pass band filter (or a reference frequency) is given by $F_{LO}-F_{LC}$ or $F_{LO}+F_{LC}$, wherein $F_{LO}$ is the local oscillator frequency provided to said transferred-impedance filter 20a (or similarly to blocks 20a-i or 20a-q) by the local oscillator 30 and $F_{LC}$ is an LC resonant frequency given by $F_{LC}=1/2\pi\sqrt{LC}$. $F_{LC}$ can be made as low as 900 kHz. Then the resultant center frequency of the pass band filter could be $F_{LO}-900$ kHz or $F_{LO}+900$ kHz (e.g., this can be important in CDMA2000). Thus, if the inductors L 46 and the capacitors C 42 are in series, there is a notch at the output of the LNA 14 which is very close to the RF frequency of the received signal.

Moreover, according to a further embodiment of the present invention, as shown in FIG. 5c, an inductor L 48 is added in parallel with the capacitors C 42 (compared to FIG. 5a) with an LC resonant frequency $F_{LC}$ given by $F_{LC}=1/2\sqrt{LC}$. It is noted that for the resonant curve with the center frequencies $F_{LO}+F_{LC}$ and $F_{LO}-F_{LC}$, the corner frequencies ($-3$ dB frequencies) of the pass band depends on the inductor L 48 (in addition to being a function of the resistor R 38 and the capacitors C 42). Thus, if the inductor L 48 and the capacitor C 42 are in parallel, then there are narrow pass bands around the resonant frequency at $F_{LO}+F_{LC}$ and $F_{LO}-F_{LC}$ where $F_{LC}=1/2\pi\sqrt{LC}$.

Inductors 46 or 48 can be generated, e.g., from capacitors with operational amplifiers (which imitate inductors) or by making a second (or higher) order filter by generating an impedance with a magnitude degrading as a second order filter response thus providing a low area, high performance filter systems.

There are a lot of variations of the present invention. It is noted that, according to an embodiment of the present invention, NMOS switches, typically used in schematics presented in FIGS. 5a, 5b and 5c, can be of other types. Moreover, the transferred-impedance filter does not necessarily have to be connected to the output of the amplifier 14. Also, it is clearly understood that the technology described in the invention can provide a broad range of LC resonant frequencies and impedances transferred to filtering of radio frequencies, according to embodiments of the present invention. Furthermore, the examples presented in FIGS. 4, 5a, 5b and 5c above utilize differential (i.e., both positive and negative) signals but the method of the present invention can be also used in single-ended systems with only one signal line.

Figure 6:
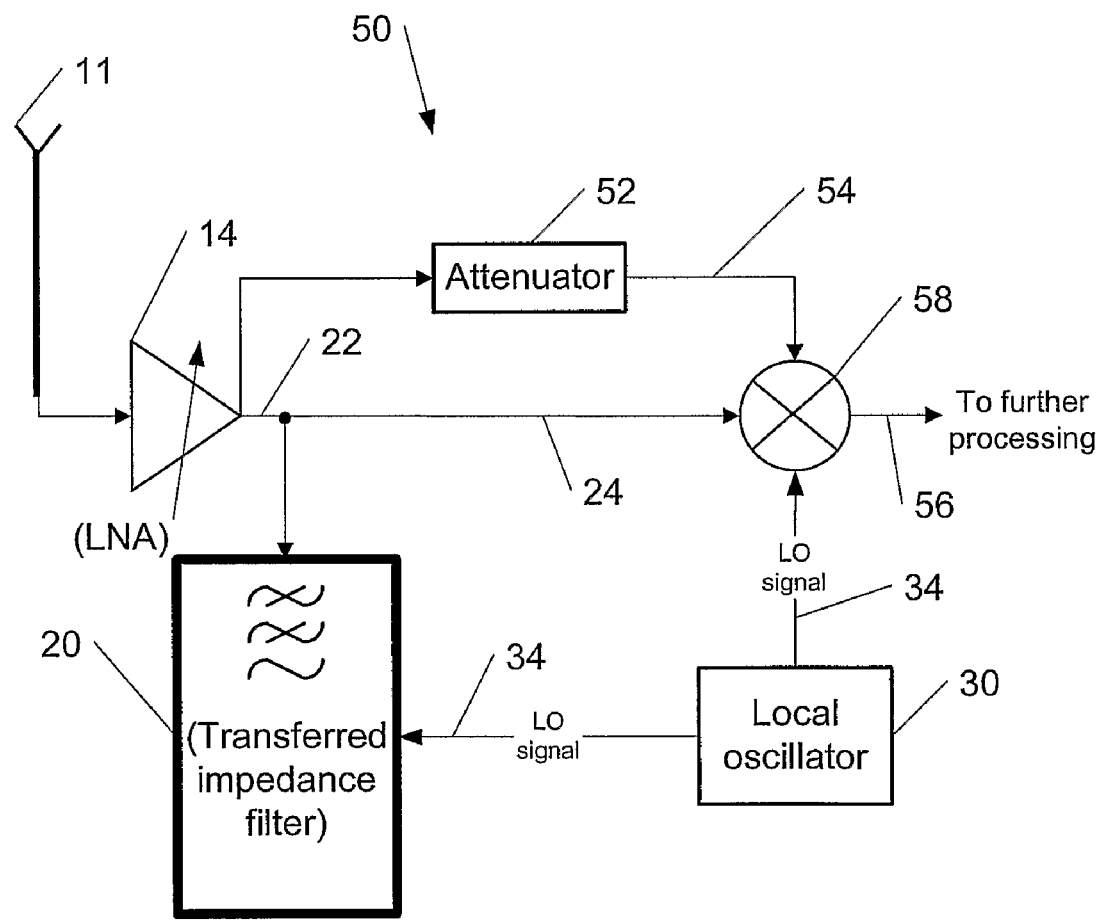
FIG. 6 is a block diagram of a front end of an RF receiver with an attenuator, according to an embodiment of the present invention.

FIGS. 6 shows an example among others of a block diagram of a front end of an RF receiver 50, according to a further embodiment of the present invention. The block diagram shown in FIG. 6 is similar to the one of FIG. 2a except for the added channel with an attenuator 52 (e.g., this attenuator can be a variable attenuator), which attenuates by a predefined value the amplified RF signal 22 in a separate channel from said transferred-impedance filter 20. Then the attenuated signal 54 and the filtered signal 24 (using the transferred-impedance filter 20) are subtracted using the mixer 58.

This subtraction can provide over 20 dB higher stop-band rejection from the circuit in the mixer output signal 56. Indeed, the desired signal 56 will not be decreased much (e.g., if the stop-band attenuation for the transferred-impedance filter 20 is 12 dB, then the subtraction will decrease the wanted signal by less than 0.3 dB), but the stop-band attenuation of the improved transferred-impedance filtering (i.e., using attenuator channel) shown in FIG. 6 can be easily 20 dB more than with conventional transferred-impedance filters (e.g., shown in FIGS. 2a or 2b).

Figure 7:
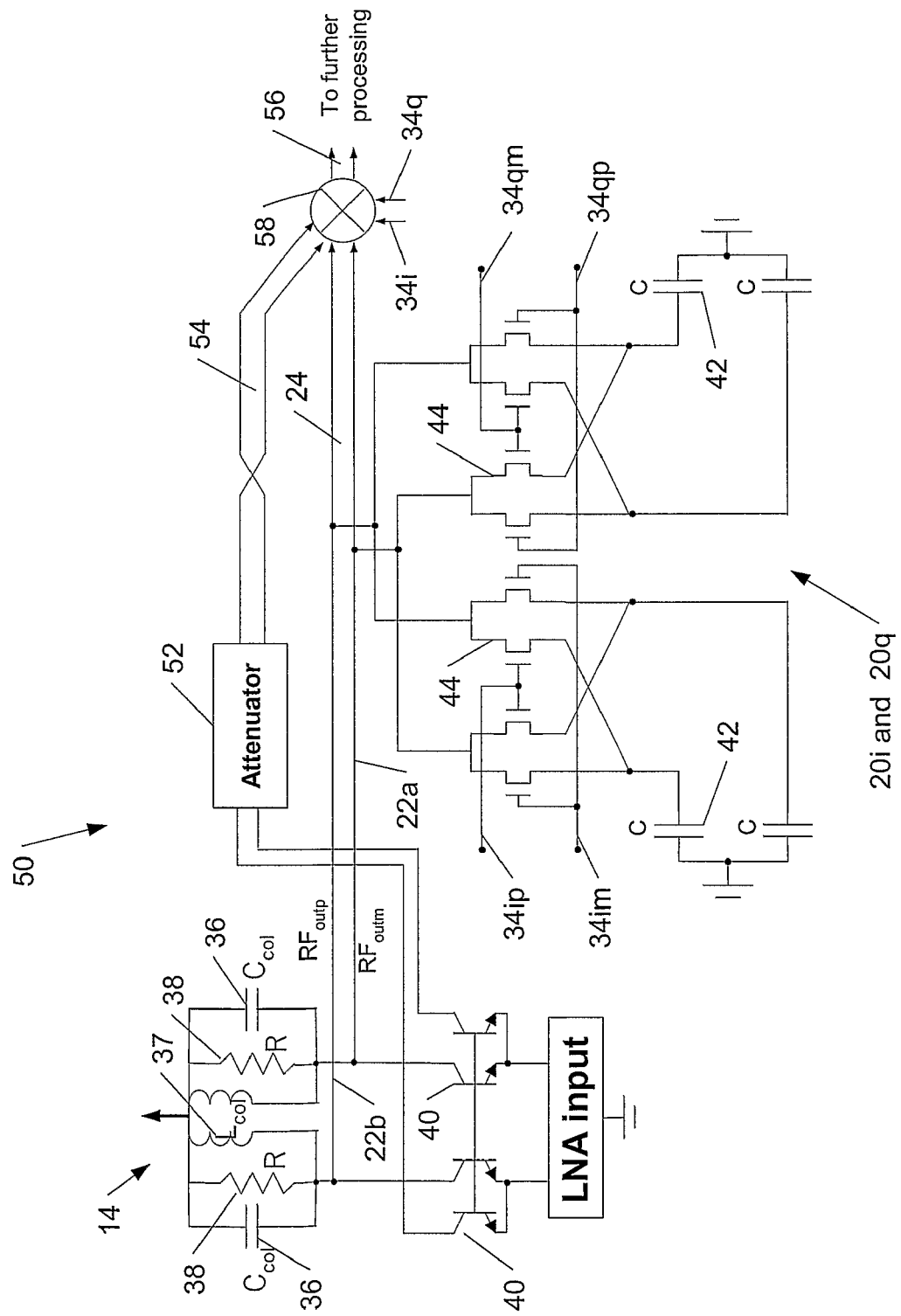
FIG. 7 is a detailed schematic of the front end of the RF receiver shown in FIG. 6, according to an embodiment of the present invention.

FIGS. 7 is another illustrative example among others of a detailed schematic on a transistor level of the front end of the RF receiver 50 shown in FIG. 6, according to an embodiment of the present invention. The circuitry elements and blocks identified by the appropriate reference numbers for clarity in FIG. 7 are described in detail in regard to FIGS. 4, 5a and 6. The challenge of the practical design of the circuitry of FIG. 7 is matching of MOS-transistor 44 channel resistance, which can be very high in modem IC process. No tuning is needed and broadband robust filtering with high stop-band attenuation can be achieved.

It is to be understood that the above-described arrangements are only illustrative of the application of the principles of the present invention. Numerous modifications and alternative arrangements may be devised by those skilled in the art without departing from the scope of the present invention, and the appended claims are intended to cover such modifications and arrangements.

What is claimed is:

1. A method, comprising:
   receiving a radio frequency signal and converting it to an electrical domain;
   amplifying said radio frequency signal in said electrical domain using an amplifier having a resistance R on its output, thus generating an amplified radio frequency signal; and
   filtering said amplified radio frequency signal using at least one transferred-impedance filter containing at least one capacitor and having a pass band with a center frequency determined by a reference frequency, wherein −3 dB frequencies of said pass band are given by said reference frequency plus a corner frequency which depends on said resistance R and a capacitance C of said at least one capacitor and by said reference frequency minus a further corner frequency which also depends on said resistance R and said capacitance C of said at least one capacitor.

2. The method of claim 1, wherein said at least one transferred-impedance filter is an amplifier.

3. The method of claim 1, further comprising:
   attenuating by a predefined or variable value the radio frequency signal in a separate channel from said transferred-impedance filter for generating an attenuated radio frequency signal; and
   generating a subtraction signal between said filtered radio frequency signal and said attenuated radio frequency signal using a mixer.

4. A receiver, comprising:
   an amplifier having a resistance R on its output, configured to amplify a radio frequency signal, and to generate an amplified radio frequency signal; and
   at least one transferred-impedance filter, configured to filter said amplified radio frequency signal, said transferred-impedance filter containing at least one capacitor and having a pass band with a center frequency determined by a reference frequency, wherein −3 dB frequencies of said pass band are given by said reference frequency plus a corner frequency which depends on said resistance R and a capacitance C of said at least one capacitor and by said reference frequency minus a further corner frequency which also depends on said resistance R and said capacitance C.

5. The receiver of claim 4, further comprising:
   an attenuator, configured to attenuate by a predefined or variable value the amplified radio frequency signal in a separate channel from said transferred-impedance filter for generating an attenuated amplified radio frequency signal; and
   a mixer, configured to generate a subtraction signal between the filtered amplified radio frequency signal and said attenuated amplified radio frequency signal.

6. The receiver of claim 4, wherein said corner frequency and said further corner frequency are equal and given by $F_{RC}=1/\pi 2RC$.

7. The receiver of claim 6, wherein said receiver contains two transferred-impedance filters of said at least one transferred-impedance filter, in inphase and quadrature branches respectively, wherein each of two local oscillator signals having said frequency $F_{LO}$ but $\pi/2$ apart in a phase domain is provided to only one of said two transferred-impedance filters.

8. The receiver of claim 4, wherein said reference frequency is a local oscillator frequency $F_{LO}$ provided to said transferred-impedance filter.

9. The receiver of claim 4, wherein said at least one transferred-impedance filter is configured to perform a down conversion mixing function such that a low frequency baseband signal is an output signal of said transferred-impedance filter.

10. The receiver of claim 4, wherein parasitic capacitances of said transferred-impedance filter are compensated by an inductor in the amplifier such that an absolute value of a reactive component of an amplifier output impedance is close to zero and negligible compared to a resistive component of said amplifier output impedance.

11. The receiver of claim 4, wherein at least one inductor L is added in series or in parallel with said at least one capacitor C and said reference frequency is given by $F_{LO}$-$F_{LC}$ or $F_{LO}$+$F_{LC}$, said $F_{LO}$ being a local oscillator frequency provided to said transferred-impedance filter and said $F_{LC}$ being an LC resonant frequency given by $F_{LC}=1/2\pi\sqrt{LC}$.

12. The receiver of claim 11, wherein said at least one inductor L is added in parallel, and said corner frequency and said further corner frequency further depends on said at least one inductor L.

13. The receiver of claim 4, wherein said receiver is a part of a mobile terminal, a mobile phone, a handset device or a mobile communication device.

14. The receiver of claim 4, wherein an integrated circuit comprises all or selected components of said receiver.

15. A communication device, comprising:
 a receiver, configured to perform transferred-impedance filtering, said receiver comprises:
  an amplifier containing a resistance R on its output and, configured to amplify a radio frequency signal and to generate, an amplified radio frequency signal; and
  at least one transferred-impedance filter, configured to filter said amplified radio frequency signal, said transferred-impedance filter containing at least one capacitor and having a pass band with a center frequency determined by a reference frequency, wherein −3dB frequencies of said pass band are given by said reference frequency plus a corner frequency which depends on said resistance R and a capacitance C of said at least one capacitor and by said reference frequency minus a further corner frequency which also depends on said resistance R and said capacitance C.

16. The communication device of claim 15, wherein the receiver further comprises:
 an attenuator, configured to attenuate by a predefined value the amplified radio frequency signal in a separate channel from said transferred-impedance filter for generating an attenuated amplified radio frequency signal; and
 a mixer, configured to generate a subtraction signal between the filtered amplified radio frequency signal and said attenuated amplified radio frequency signal.

17. A transferred-impedance filter coupled to an amplifier having a resistance R, said transferred-impedance filter comprising:
 at least one capacitor, said one transferred-impedance filter being configured to filter a radio frequency signal from said amplifier and to generate a filtered radio frequency signal, and further configured to have a pass band with a center frequency determined by a reference frequency, wherein −3 dB frequencies of said pass band are given by said reference frequency plus a corner frequency which depends on said resistance R and a capacitance C of said at least one capacitor and by said reference frequency minus a further corner frequency which also depends on said resistance R and said capacitance C.

18. The transferred-impedance filter of claim 17, wherein said corner frequency and said further corner frequency are equal and given by $F_{RC}=1/\pi 2RC$.

19. The transferred-impedance filter of claim 17, wherein said reference frequency is a local oscillator frequency $F_{LO}$ provided to said transferred-impedance filter.

20. The transferred-impedance filter of claim 17, wherein said transferred-impedance filter is configured to perform a down conversion mixing function such that a low frequency baseband signal is an output signal of said transferred-impedance filter.

21. The transferred-impedance filter of claim 17, further comprising:
 at least one inductor L added in series with said at least one capacitor C and said reference frequency is given by $F_{LO}\text{-}F_{LC}$ or $F_{LO}\text{+}F_{LC}$, said $F_{LO}$ being a local oscillator frequency provided to said transferred-impedance filter and said $F_{LC}$ being an LC resonant frequency given by $F_{LC}=1/2\pi\sqrt{LC}$.

22. The transferred-impedance filter of claim 17, further comprising:
 at least one inductor L is added in parallel with said at least one capacitor C and said reference frequency is given by $F_{LO}\text{-}F_{LC}$ or $F_{LO}\text{=}F_{LC}$, said $F_{LO}$ being a local oscillator frequency provided to said transferred-impedance filter and said $F_{LC}$ being an LC resonant frequency given by $F_{LC}=1/2\pi\sqrt{LC}$.

23. The transferred-impedance filter of claim 22, wherein said corner frequency and said further corner frequency further depends on said at least one inductor L.

24. The transferred-impedance filter of claim 17, wherein said transferred-impedance filter is a part of a receiver, a mobile terminal, mobile phone, a handset device or a mobile communication device.

25. The transferred-impedance filter of claim 17, wherein an integrated circuit comprises all or selected components of said transferred-impedance filter

\* \* \* \* \*